United States Patent
Lee et al.

(10) Patent No.: US 8,647,934 B2
(45) Date of Patent: Feb. 11, 2014

(54) THIN FILM TRANSISTOR AND FABRICATING METHOD THEREOF

(75) Inventors: Liu-Chung Lee, Hsinchu County (TW); Hung-Che Ting, Taipei (TW); Chia-Yu Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 251 days.

(21) Appl. No.: 13/097,082

(22) Filed: Apr. 29, 2011

(65) Prior Publication Data
US 2012/0168743 A1    Jul. 5, 2012

(30) Foreign Application Priority Data
Dec. 30, 2010    (TW) ................ 99146936 A

(51) Int. Cl.
H01L 21/84    (2006.01)
(52) U.S. Cl.
USPC ........... 438/158; 438/160; 438/166; 438/159; 257/43; 257/49; 257/59; 257/E29.29
(58) Field of Classification Search
USPC ............. 257/43, 49, 56–59, 291, E29.29; 438/158–160, 166, E21.414
See application file for complete search history.

(56) References Cited

U.S. PATENT DOCUMENTS

| | | | |
|---|---|---|---|
| 8,058,647 B2 | 11/2011 | Kuwabara et al. | |
| 8,164,090 B2 | 4/2012 | Iwasaki et al. | |
| 2009/0140243 A1 | 6/2009 | Kim et al. | |
| 2010/0051933 A1 * | 3/2010 | Kim et al. | 257/43 |
| 2010/0051940 A1 | 3/2010 | Yamazaki et al. | |
| 2010/0051949 A1 | 3/2010 | Yamazaki et al. | |
| 2010/0084655 A1 | 4/2010 | Iwasaki et al. | |
| 2010/0117078 A1 | 5/2010 | Kuwabara et al. | |
| 2010/0140614 A1 | 6/2010 | Uchiyama et al. | |
| 2012/0058600 A1 | 3/2012 | Kuwabara et al. | |

FOREIGN PATENT DOCUMENTS

| | | |
|---|---|---|
| CN | 101719514 | 6/2010 |
| CN | 101740634 | 6/2010 |
| CN | 101894760 | 11/2010 |
| TW | 200915579 | 4/2009 |
| TW | 200938660 | 9/2009 |

OTHER PUBLICATIONS

"Notice of Allowance of China Counterpart Application", issued on Jul. 16, 2012, p. 1-p. 4.
"First Office Action of China counterpart application" issued on May 14, 2012, p. 1-p. 5.
"Office Action of Taiwan Counterpart Application", issued on Jun. 21, 2013, p. 1-p. 7.

* cited by examiner

*Primary Examiner* — Mark A Laurenzi
(74) *Attorney, Agent, or Firm* — Jianq Chyun IP Office

(57) ABSTRACT

A thin film transistor (TFT) including a gate, a gate insulator, an oxide semiconductor channel layer, a source, and a drain is provided. The gate insulator covers the gate, while the oxide semiconductor channel layer is configured on the gate insulator and located above the gate. The oxide semiconductor channel layer includes a first sub-layer and a second sub-layer located on the first sub-layer. An oxygen content of the first sub-layer is lower than an oxygen content of the second sub-layer. The source and the drain are configured on a portion of the second sub-layer. In addition, a fabricating method of the above-mentioned TFT is also provided.

15 Claims, 3 Drawing Sheets

THIN FILM TRANSISTOR AND FABRICATING METHOD THEREOF

CROSS-REFERENCE TO RELATED APPLICATION

This application claims the priority benefit of Taiwan application serial no. 99146936, filed on Dec. 30, 2010. The entirety of the above-mentioned patent application is hereby incorporated by reference herein and made a part of this specification.

BACKGROUND OF THE INVENTION

1. Field of the Invention

The invention relates to a thin film transistor (TFT) and a fabricating method thereof. More particularly, the invention relates to a TFT having an oxide semiconductor channel layer and a fabricating method of the TFT.

2. Description of Related Art

With the rising awareness of environmental protection, flat display panels featuring low power consumption, optimal space utilization, and high definition have gradually become the mainstream products in the market of the displays. Common flat display panels include liquid crystal displays, plasma displays, organic light emitting diode displays, and so forth. The most popular liquid crystal display exemplified herein is mainly comprised of a TFT array substrate, a color filter substrate, and a liquid crystal layer sandwiched between the two substrates. In the conventional TFT array substrate, an amorphous silicon (a-Si) TFT or a low-temperature polysilicon (LTPS) TFT often serves as a switch element of each sub-pixel. According to recent researches, the oxide semiconductor TFT has greater mobility than the a-Si TFT. The oxide semiconductor TFT has a more stable threshold voltage Vth than the LTPS TFT. Hence, the oxide semiconductor TFT has great potential for becoming the key element of the next-generation flat display panel.

In the conventional oxide semiconductor TFT, the threshold voltage Vth of the oxide semiconductor channel layer is shifted after the oxide semiconductor channel layer is irradiated by ultraviolet (UV) light or operated under negative bias stress, and thereby electric properties and reliability of the oxide semiconductor TFT are affected. As a result, how to resolve the issue of threshold voltage shifts in the oxide semiconductor TFT demands immediate attention of manufacturers.

SUMMARY OF THE INVENTION

The invention is directed to a TFT and a fabricating method thereof.

In an embodiment of the invention, a TFT that includes a gate, a gate insulator, an oxide semiconductor channel layer, a source, and a drain is provided. The gate insulator covers the gate, while the oxide semiconductor channel layer is configured on the gate insulator and located above the gate. The oxide semiconductor channel layer includes a first sub-layer and a second sub-layer located on the first sub-layer. An oxygen content of the first sub-layer is lower than an oxygen content of the second sub-layer. The source and the drain are configured on a portion of the second sub-layer.

In an embodiment of the invention, a TFT that includes a gate, a gate insulator, an oxide semiconductor channel layer, a source, and a drain is provided. The gate insulator covers the gate. The oxide semiconductor channel layer is configured on the gate insulator and located above the gate. Here, the oxide semiconductor channel layer is a single film layer and has a first portion and a second portion. The second portion is located on the first portion. In other words, the first portion is located between the second portion and the gate insulator. A crystallite size of the first portion is greater than a crystallite size of the second portion. The source and the drain are configured on the oxide semiconductor channel layer.

According to an embodiment of the invention, the oxide semiconductor channel layer includes an a-Si oxide semiconductor channel layer. For instance, a material of the oxide semiconductor channel layer includes indium gallium zinc oxide (IGZO), indium zinc oxide (IZO), indium gallium oxide (IGO), zinc oxide (ZnO), $2CdO.GeO_2$, or $NiCo_2O_4$.

According to an embodiment of the invention, the second sub-layer is an UV shielding layer.

According to an embodiment of the invention, the TFT further includes a third sub-layer configured between the first sub-layer and the second sub-layer. An oxygen content of the third sub-layer ranges from the oxygen content of the first sub-layer and the oxygen content of the second sub-layer.

According to an embodiment of the invention, the TFT further includes a plurality of third sub-layers configured between the first sub-layer and the second sub-layer. The closer the third sub-layers to the first sub-layer, the lower the oxygen contents of the third sub-layers; the closer the third sub-layers to the second sub-layer, the higher the oxygen contents of the third sub-layers.

According to an embodiment of the invention, a reactive oxygen/argon flow ratio of a sputtering process of the first sub-layer ranges from about 0 to about 10, and a reactive oxygen/argon flow ratio of a sputtering process of the second sub-layer ranges from about 5 to about 80.

According to an embodiment of the invention, the first sub-layer has a first tapered sidewall, the second sub-layer has a second tapered sidewall, and the second tapered sidewall is steeper than the first tapered sidewall.

In an embodiment of the invention, a fabricating method of a TFT is provided. In the fabricating method, a gate is formed on a substrate, and a gate insulator is formed on the substrate to cover the gate. A first sub-layer and a second sub-layer are sequentially formed on the gate insulator that is located above the gate. An oxygen content of the first sub-layer is lower than an oxygen content of the second sub-layer. A source and a drain are formed on a portion of the second sub-layer.

According to an embodiment of the invention, the step of forming the first sub-layer and the second sub-layer includes: forming a first material layer on the gate insulator when a reactive oxygen/argon flow ratio of a sputtering process of the first material layer is given; forming a second material layer on the first material layer when a reactive oxygen/argon flow ratio of a sputtering process of the second material layer is given; patterning the first material layer and the second material layer to form the first sub-layer and the second sub-layer.

According to an embodiment of the invention, the step of forming the first material layer and the second material layer includes forming a patterned photoresist layer on the second material layer and removing a portion of the first material layer and a portion of the second material layer with use of the patterned photoresist layer as a mask. Here, the portion of the first material layer and the portion of the second material layer are not covered by the patterned photoresist layer.

According to an embodiment of the invention, the first material layer and the second material layer are patterned by performing an etch process with an etchant.

According to an embodiment of the invention, the etchant is oxalic acid, for instance.

According to an embodiment of the invention, the reactive oxygen/argon flow ratio of the sputtering process of the first material layer ranges from about 0 to about 10, for instance, and the reactive oxygen/argon flow ratio of the sputtering process of the second material layer ranges from about 5 to about 80, for instance.

In an embodiment of the invention, a TFT that includes a gate, a gate insulator, an oxide semiconductor channel layer, a source, and a drain is further provided. The gate insulator covers the gate. The oxide semiconductor channel layer is configured on the gate insulator and located above the gate. Here, the oxide semiconductor channel layer includes a first portion and a second portion, and the second portion is located on the first portion. An oxygen content of the first portion is lower than an oxygen content of the second portion. The source and the drain are configured on the oxide semiconductor channel layer.

The oxide semiconductor described in the embodiments of the invention includes multiple sub-layers with different oxygen contents. Through the sub-layers having high oxygen contents, the threshold voltage shift can be prevented, and UV can be shielded. Consequently, the TFT of this invention can have favorable electric properties and reliability.

To make the above and other features and advantages of the invention more comprehensible, several embodiments accompanied with figures are detailed as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1A:
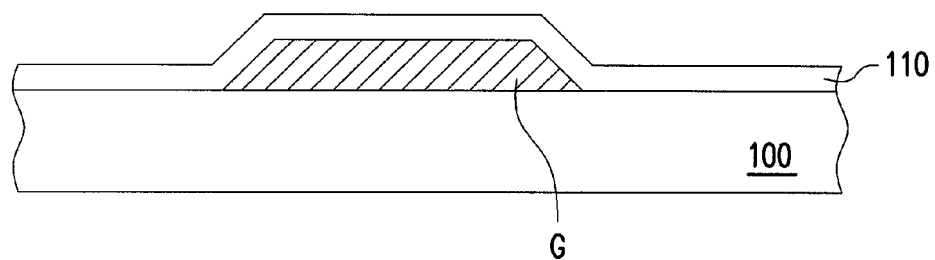
FIG. 1A to FIG. 1E are schematic views illustrating a process of fabricating a TFT according to an embodiment of the invention.

FIG. 1A to FIG. 1E are schematic views illustrating a process of fabricating a TFT according to an embodiment of the invention. With reference to FIG. 1A, a gate G is formed on a substrate 100. In this embodiment, the gate G is formed by depositing a conductive thin film and performing a photolithography and etch process, for instance. The gate G is made of aluminum, copper, molybdenum, an alloy thereof, a layer in which at least two of the aforesaid metal materials are stacked, or any other conductive material, for instance. After the gate G is formed, a gate insulator 110 is formed on the substrate 100 to cover the gate G. Here, the gate insulator 110 completely covers the substrate 100 and the gate G, for instance. In this embodiment, the gate insulator 110 is made of silicon oxide, silicon nitride, silicon oxynitride, or any other dielectric material, for instance.

Figure 1B:
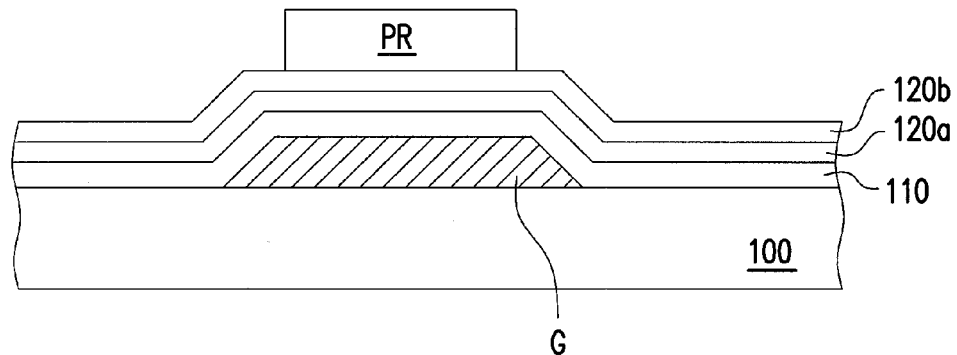
Figure 1C:
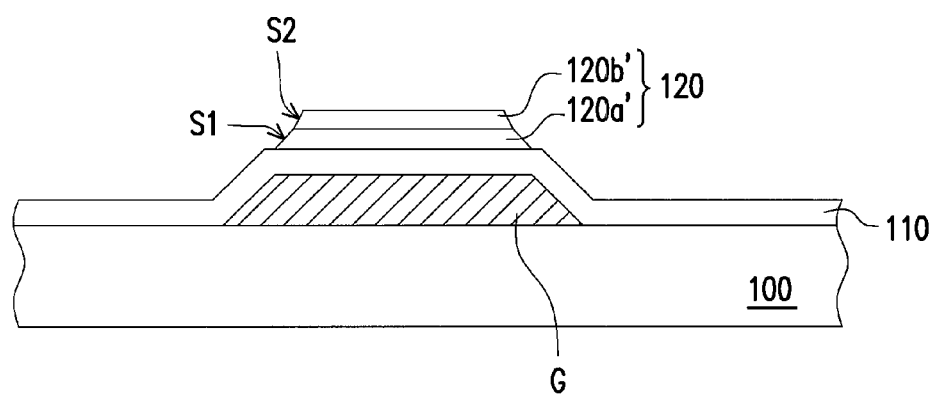

With reference to FIG. 1B and FIG. 1C, after the gate insulator 110 is formed, an oxide semiconductor channel layer 120 (shown in FIG. 1C) is formed on the gate insulator 110 located above the gate G. In this embodiment, the oxide semiconductor channel layer 120 is made of IGZO, IZO, IGO, ZnO, $2CdO.GeO_2$, or $NiCo_2O_4$, for instance. A method of forming the oxide semiconductor channel layer 120 is described below. A first material layer 120a and a second material layer 120b are sequentially formed on the gate insulator 110. An oxygen content of the first material layer 120a is lower than that of the second material layer 120b. In this embodiment, the first material layer 120a and the second material layer 120b are, for instance, continuously deposited on the surface of the gate insulator 110 by sputtering, for instance. For example, the first material layer 120a is formed when the reactive gas applied in the sputtering process is a mixture of oxygen and argon. During the sputtering process of the first material layer 120a, the reactive oxygen/argon flow ratio of the sputtering process ranges from about 0 to about 10, for instance. By contrast, during the sputtering process of the second material layer 120b, the reactive oxygen/argon flow ratio of the sputtering process ranges from about 5 to about 80, for instance.

Specifically, the first material layer 120a can be formed on the gate insulator 110 when a reactive oxygen/argon flow ratio of the sputtering process of the first material layer 120a is given, and the second material layer 120b can be formed on the first material layer 120a when a reactive oxygen/argon flow ratio of the sputtering process of the second material layer 120b is given. Note that the reactive oxygen/argon flow ratio of the sputtering process of the first material layer 120a is lower than the reactive oxygen/argon flow ratio of the sputtering process of the second material layer 120b. For instance, the reactive oxygen/argon flow ratio of the sputtering process of the first material layer 120a ranges from about 0 to about 10, and the reactive oxygen/argon flow ratio of the sputtering process of the second material layer 120b ranges from about 5 to about 80. The first material layer 120a and the second material layer 120b are made of similar materials, while the difference between the first and second material layers 120a and 120b lies in the oxygen content. Hence, the process of fabricating the first and second material layers 120a and 120b is compatible with the current fabricating process and thus does not lead to the significant increase in the manufacturing costs.

After the first and second material layers 120a and 120b are formed, a patterned photoresist layer PR is formed on the second material layer 120b. A portion of the first material layer 120a and a portion of the second material layer 120b that are not covered by the patterned photoresist layer PR are removed with use of the patterned photoresist layer PR as a mask, so as to form a first sub-layer 120a' and a second sub-layer 120b'. For instance, the first material layer 120a and the second material layer 120b are suitable for being etched by an etchant (e.g., oxalic acid) to form the first and second sub-layers 120a' and 120b'. After the first and second material layers 120a and 120b are etched by oxalic acid or any other similar etchant to form the first and second sub-layers 120a' and 120b', the first sub-layer 120a' has a first tapered sidewall S1, and the second sub-layer 120b' has a second tapered sidewall S2. Since the oxygen content of the first material layer 120a is lower than that of the second material layer 120b, the second tapered sidewall S2 is steeper than the first tapered sidewall S1. In this embodiment, the inclined angle of the first tapered sidewall S1 ranges from about 10° to about 40°, for instance, and the inclined angle of the second tapered sidewall S2 ranges from about 30° to about 90°, for instance. The lateral etching phenomenon is not apt to occur in the film layer having a relatively high oxygen content during the etch process, and therefore the tapered sidewall of the film layer having the relatively high oxygen content is steep. The difference between the oxygen contents of the first and second material layers 120a and 120b results in the difference between the inclined angle of the first tapered sidewall S1 and the inclined angle of the second tapered sidewall S2.

As indicated in FIG. 1C, the oxide semiconductor channel layer 120 is formed by the first and second sub-layers 120a' and 120b', and the oxygen content of the first sub-layer 120a' is lower than that of the second sub-layer 120b'. In this embodiment, the partial pressure ratio of reactive oxygen/argon of sputtering process of the first sub-layer 120a' ranges from about 5 to about 10, for instance, and the partial pressure ratio of reactive oxygen/argon of sputtering process of the second sub-layer 120b' is about 10 or more, for instance.

Figure 1D:
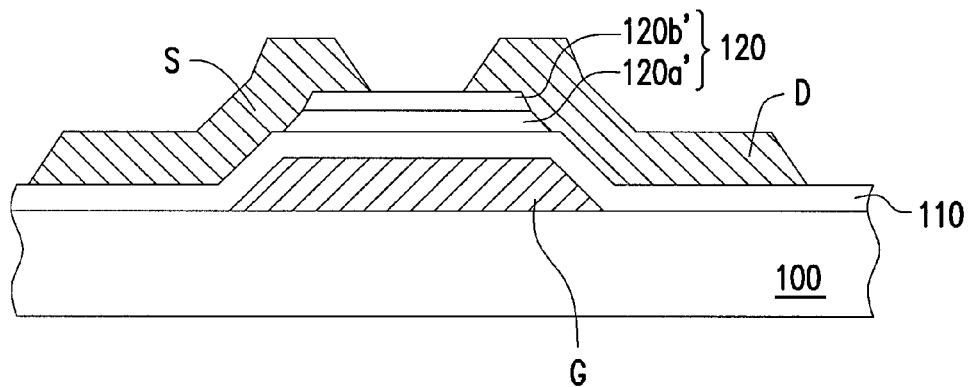

With reference to FIG. 1D, after the oxide semiconductor channel layer 120 is formed, the source S and the drain D are formed on a portion of the second sub-layer 120b'. The source S and the drain D are electrically insulated from each other and respectively cover a portion of the oxide semiconductor channel layer 120. Besides, the source S and the drain D extend from the top of the oxide semiconductor channel layer 120 to the two opposite sides of the gate G. In this embodiment, the source S and the drain D are formed by depositing a conductive thin film and performing a photolithography and etch process, for instance. Besides, the source S and the drain D are made of aluminum, copper, molybdenum, an alloy thereof, a layer in which at least two of the aforesaid metallic materials are stacked, or any other conductive material, for instance.

The TFT of this embodiment is basically formed after the source S and the drain D are completely fabricated.

As indicated in FIG. 1D, the TFT of this embodiment includes a gate G, a gate insulator 110, an oxide semiconductor channel layer 120, a source S, and a drain D. The gate insulator 110 covers the gate G, while the oxide semiconductor channel layer 120 is configured on the gate insulator 110 and located above the gate G. The oxide semiconductor channel layer 120 includes a first sub-layer 120a' and a second sub-layer 120b' located on the first sub-layer 120a'. An oxygen content of the first sub-layer 120a' is lower than that of the second sub-layer 120b'. The source S and the drain D are configured on a portion of the second sub-layer 120b'. In this embodiment, the oxide semiconductor channel layer 120 is made of IGZO, IZO, IGO, ZnO, 2CdO.GeO$_2$, or NiCo$_2$O$_4$, for instance.

The oxygen content of the second sub-layer 120b' is relatively high, and thus the second sub-layer 120b' can act as an UV shielding layer. ITO or IZO with the high oxygen content can block the UV, and thus the second sub-layer 120b' made of indium tin zinc oxide (ITZO) having the high oxygen content can effectively prevent the UV from damaging the first sub-layer 120a' and affecting the oxide semiconductor channel layer 120, e.g., precluding the threshold voltage shift. In addition, the second tapered sidewall S2 of the second sub-layer 120b' is steeper than the first tapered sidewall Si of the first sub-layer 120a'. However, the inclined angles of the first and second tapered sidewalls S1 and S2 may be changed when different etchants are applied.

Figure 2:
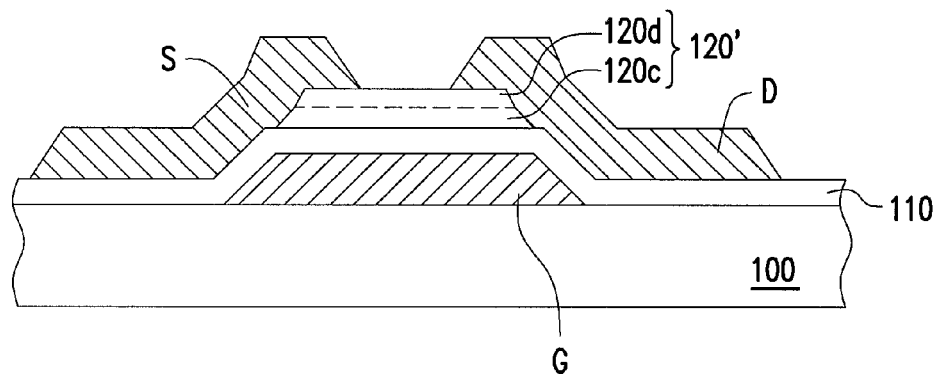
FIG. 2 is a schematic cross-sectional view illustrating a TFT according to another embodiment of the invention.

Certainly, in the oxide semiconductor channel layer 120 depicted in FIG. 1D, the interface between the first and second sub-layers 120a' and 120b' can be recognized by a scanning electron microscope (SEM). By properly modifying the manufacturing parameters, as indicated in FIG. 2, the oxide semiconductor channel layer 120' which is a single film layer and has a first portion 120c and a second portion 120d can be formed. The second portion 120d is located on the first portion 120c, and the oxygen content of the first portion 120c is lower than that of the second portion 120d. In other words, the first portion 120c is located between the second portion 120d and the gate insulator 110. The interface between the first and second portions 120c and 120d can be identified through analyzing different oxygen content spectra by applying X-ray diffraction (XRD) spectra techniques, for instance. The oxygen content of the oxide semiconductor layer 120' from bottom to top has a gradational arrangement, i.e., the oxygen content of the first portion 120c underlying the second portion 120d is lower than the oxygen content of the second portion 120d. In the oxide semiconductor layer 120', the oxygen content from the bottom surface of the first portion 120c to the upper surface of the second portion 120d increases gradually and continuously, for example. In the oxide semiconductor channel layer 120', note that the average crystallite size of the first portion 120c having a relatively low amount of oxygen flow or a relatively low oxygen content is greater than the average crystallite size of the second portion 120d having a relatively high amount of oxygen flow or a relatively high oxygen content.

Figure 1E:
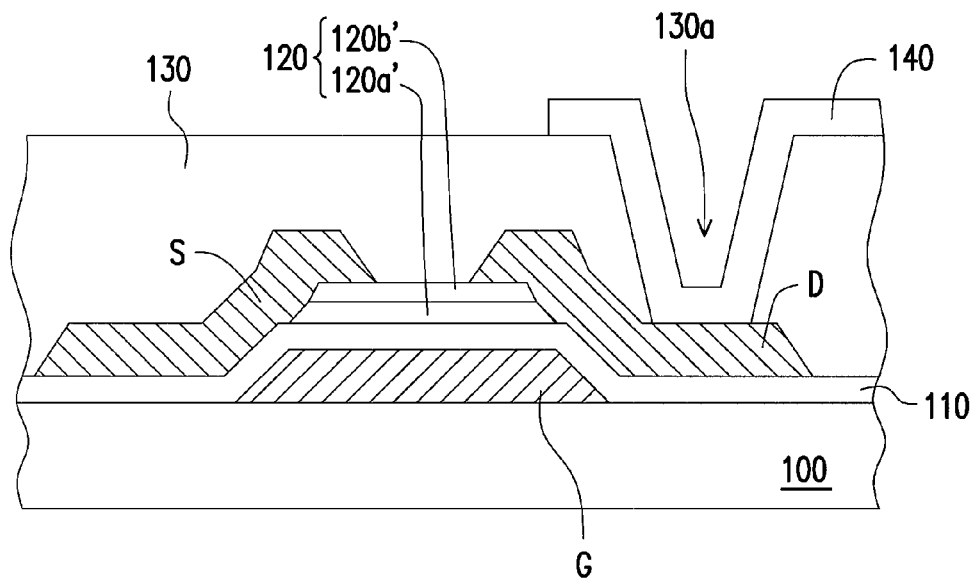

With reference to FIG. 1E, to further improve the reliability of the TFT, a passivation layer 130 can be selectively formed on the TFT. When the aforesaid TFT is applied to each pixel in a display, a contact via 130a can be formed in the passivation layer 130 in this embodiment, and a pixel electrode 140 can be formed on the passivation layer 130, such that the pixel electrode 140 can be electrically connected to the drain D of the TFT through the contact via 130a.

Figure 3:
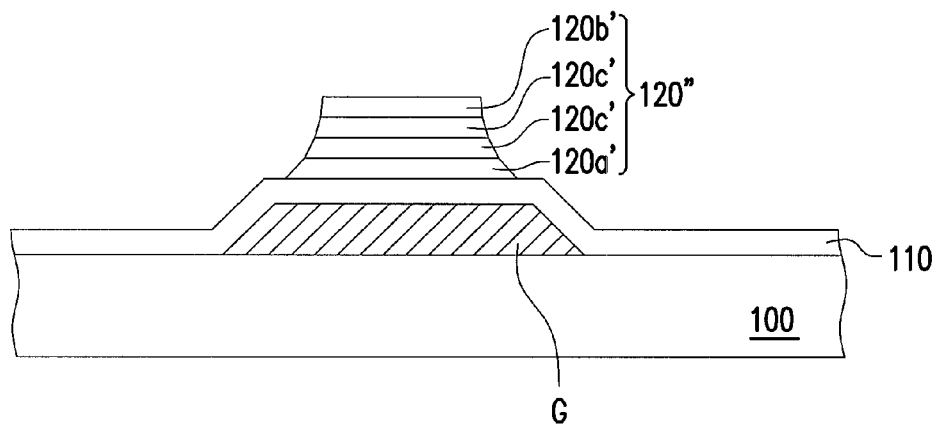
FIG. 3 is a schematic cross-sectional view illustrating an oxide semiconductor channel layer according to another embodiment of the invention.

FIG. 3 is a schematic cross-sectional view illustrating an oxide semiconductor channel layer according to another embodiment of the invention. With reference to FIG. 3, the oxide semiconductor channel layer 120" of this embodiment includes a first sub-layer 120', a second sub-layer 120b', and at least one third sub-layer 120c'. The third sub-layer 120c' is configured between the first and second sub-layers 120a' and 120b'. The oxygen content of the third sub-layer 120c' ranges from the oxygen content of the first sub-layer 120a' and the oxygen content of the second sub-layer 120b'. When the number of the third sub-layers 120c' is equal to or greater than 2, the third sub-layers 120c' are configured between the first and second sub-layers 120a' and 120b' as well. The closer the third sub-layers 120c' to the first sub-layer 120a', the lower the oxygen contents of the third sub-layers 120c'. The closer the third sub-layers 120c' to the second sub-layer 120b', the higher the oxygen contents of the third sub-layers 120c'. Namely, in the oxide semiconductor channel layer 120", the oxygen contents of the sub-layers increase from bottom to top.

The first, second, and third sub-layers 120a', 120b', and 120c' can be continuously deposited on the surface of the gate insulator 110 by performing a sputtering process, for instance. During the sputtering process, multiple material layers can be sequentially formed on the gate insulator 110 when different reactive oxygen/argon flow ratios of the sputtering process are given, and the material layers are patterned by performing a photolithography and etch process, so as to form the first, second, and third sub-layers 120a', 120b' and 120c'.

The oxide semiconductor described in the embodiments of the invention includes multiple sub-layers (two or more) with different oxygen contents. Through the sub-layers having high oxygen contents, the threshold voltage shift can be prevented, and UV can be shielded. Consequently, the TFT of this invention can have favorable electric properties and reliability.

Although the invention has been disclosed by the above embodiments, they are not intended to limit the invention. Those skilled in the art may make some modifications and alterations without departing from the spirit and scope of the invention. Therefore, the protection range of the invention falls in the appended claims.

What is claimed is:

1. A thin film transistor comprising:
   a gate;
   a gate insulator covering the gate;
   an oxide semiconductor channel layer configured on the gate insulator and located above the gate, the oxide semiconductor channel layer comprising a first sub-layer and a second sub-layer located on the first sub-layer, an oxygen content of the first sub-layer being lower than an oxygen content of the second sub-layer, wherein the first sub-layer has a first tapered sidewall, the second sub-layer has a second tapered sidewall, and the second tapered sidewall is steeper than the first tapered sidewall; and
   a source and a drain configured on a portion of the second sub-layer.

2. The thin film transistor as claimed in claim 1, wherein the oxide semiconductor channel layer comprises an amorphous oxide semiconductor channel layer.

3. The thin film transistor as claimed in claim 1, wherein a material of the oxide semiconductor channel layer comprises indium gallium zinc oxide, indium zinc oxide, indium gallium oxide, zinc oxide, $2CdO \cdot GeO_2$, or $NiCo_2O_4$.

4. The thin film transistor as claimed in claim 1, wherein the second sub-layer is an ultraviolet shielding layer.

5. The thin film transistor as claimed in claim 1, further comprising a third sub-layer configured between the first sub-layer and the second sub-layer, an oxygen content of the third sub-layer ranging from the oxygen content of the first sub-layer and the oxygen content of the second sub-layer.

6. The thin film transistor as claimed in claim 1, further comprising a plurality of third sub-layers configured between the first sub-layer and the second sub-layer, an oxygen content of each of the third sub-layers ranging from the oxygen content of the first sub-layer and the oxygen content of the second sub-layer, the oxygen contents of the third sub-layers close to the first sub-layer being lower than the oxygen contents of the third sub-layers close to the second sub-layer.

7. The thin film transistor as claimed in claim 1, wherein a reactive oxygen/argon flow ratio of a sputtering process of the first sub-layer ranges from about 0 to about 10, and a reactive oxygen/argon flow ratio of a sputtering process of the second sub-layer ranges from about 5 to about 80.

8. A thin film transistor comprising:
   a gate;
   a gate insulator covering the gate;
   an oxide semiconductor channel layer configured on the gate insulator and located above the gate, the oxide semiconductor channel layer being a single film layer and having a first portion and a second portion, the first portion being located between the second portion and the gate insulator, a crystallite size of the first portion being greater than a crystallite size of the second portion; and
   a source and a drain configured on the oxide semiconductor channel layer.

9. A fabricating method of a thin film transistor, comprising:
   forming a gate on a substrate;
   forming a gate insulator on the substrate to cover the gate;
   sequentially forming a first sub-layer and a second sub-layer on the gate insulator located above the gate, wherein an oxygen content of the first sub-layer is lower than that of the second sub-layer, wherein the first sub-layer has a first tapered sidewall, the second sub-layer has a second tapered sidewall, and the second tapered sidewall is steeper than the first tapered sidewall; and
   forming a source and a drain on a portion of the second sub-layer.

10. The fabricating method of the thin film transistor as claimed in claim 9, wherein the step of forming the first sub-layer and the second sub-layer comprises:
    forming a first material layer on the gate insulator when a reactive oxygen/argon flow ratio of a sputtering process of the first material layer is given;
    forming a second material layer on the first material layer when a reactive oxygen/argon flow ratio of a sputtering process of the second material layer is given; and
    patterning the first material layer and the second material layer to form the first sub-layer and the second sub-layer.

11. The fabricating method of the thin film transistor as claimed in claim 10, wherein the step of forming the first material layer and the second material layer comprises:
    forming a patterned photoresist layer on the second material layer; and
    removing a portion of the first material layer and a portion of the second material layer with use of the patterned photoresist layer as a mask, the portion of the first material layer and the portion of the second material layer being not covered by the patterned photoresist layer.

12. The fabricating method of the thin film transistor as claimed in claim 11, wherein the first material layer and the second material layer are patterned by performing an etch process with an etchant.

13. The fabricating method of the thin film transistor as claimed in claim 12, wherein the etchant comprises oxalic acid.

14. The thin film transistor as claimed in claim 10, wherein the reactive oxygen/argon flow ratio of the sputtering process of the first material layer ranges from about 0 to about 10, and the reactive oxygen/argon flow ratio of the sputtering process of the second material layer ranges from about 5 to about 80.

15. The thin film transistor as claimed in claim 1, wherein an inclined angle of the first tapered sidewall ranges from 10° to 40°, and an inclined angle of the second tapered sidewall ranges from 30° to 90°.

* * * * *